United States Patent
Zhao et al.

(10) Patent No.: US 10,964,744 B1
(45) Date of Patent: Mar. 30, 2021

(54) LIGHT CONTROL FOR IMPROVED NEAR INFRARED SENSITIVITY AND CHANNEL SEPARATION

(71) Applicant: OMNIVISION TECHNOLOGIES, INC., Santa Clara, CA (US)

(72) Inventors: Cheng Zhao, San Jose, CA (US); Chen-Wei Lu, San Jose, CA (US); Cunyu Yang, Milpitas, CA (US); Ping-Hsu Chen, Oakland, CA (US); Zhiqiang Lin, San Jose, CA (US); Chengming Liu, Fremont, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 48 days.

(21) Appl. No.: 16/570,920

(22) Filed: Sep. 13, 2019

(51) Int. Cl.
*G01J 5/20* (2006.01)
*H01L 27/14* (2006.01)
*H01L 27/146* (2006.01)

(52) U.S. Cl.
CPC .. *H01L 27/14649* (2013.01); *H01L 27/14603* (2013.01); *H01L 27/14609* (2013.01); *H01L 27/14621* (2013.01); *H01L 27/14645* (2013.01)

(58) Field of Classification Search
CPC ......... H01L 27/14649; H01L 27/14603; H01L 27/14621; H01L 27/14609; H01L 27/14645
See application file for complete search history.

(56) References Cited

U.S. PATENT DOCUMENTS

| | | | | |
|---|---|---|---|---|
| 2009/0002531 | A1* | 1/2009 | Godaiin | H01L 27/14641 348/294 |
| 2011/0260059 | A1* | 10/2011 | Jiang | H04N 5/37452 250/330 |
| 2017/0317131 | A1* | 11/2017 | Shimada | G02B 5/22 |
| 2017/0317132 | A1* | 11/2017 | Hatakeyama | G02B 5/223 |
| 2018/0131881 | A1* | 5/2018 | Kobayashi | H01L 27/14625 |

\* cited by examiner

*Primary Examiner* — Kiho Kim

(74) *Attorney, Agent, or Firm* — Christensen O'Connor Johnson Kindness PLLC

(57) ABSTRACT

Light control for improved near infrared sensitivity and channel separation for an image sensor. In one embodiment, an image sensor includes: a plurality of photodiodes arranged in rows and columns of a pixel array; and a light filter layer having a plurality of light filters configured over the plurality of photodiodes. The light filter layer has a first side facing the plurality of photodiodes and a second side facing away from the first side. The image sensor also includes a color filter layer having a plurality of color filters configured over the plurality of photodiodes. The color filter layer has a first surface facing the second side of the light filter layer and a second surface facing away from the first layer. Individual micro-lenses are configured to direct incoming light through corresponding light filter and color filter onto the respective photodiode.

20 Claims, 14 Drawing Sheets

LIGHT CONTROL FOR IMPROVED NEAR INFRARED SENSITIVITY AND CHANNEL SEPARATION

BACKGROUND INFORMATION

Field of the Disclosure

This disclosure relates generally to the design of counters of image sensors, and in particular relates to the image sensor used for infrared light.

Background

Image sensors have become ubiquitous. They are widely used in digital still cameras, cellular phones, security cameras, as well as medical, automobile, and other applications. The technology for manufacturing image sensors continues to advance at a great pace. For example, the demands for higher image sensor resolution and lower power consumption motivate further miniaturization and integration of image sensors into digital devices.

Some image sensors are used for near infrared (NIR) sensing (for simplicity and brevity also referred to as the infrared or IR sensing). IR sensing is commonly defined to include the light wavelengths from about 700 nm to about 1000 nm. The IR sensing may be useful for imaging that would otherwise be beyond visual perception. When IR light is emitted toward and reflected from an object, an IR sensor registers the reflected light. In different applications, the IR sensing can gauge object distance, size, location, and identifying features.

Individual pixels of image sensor are typically sensitive to multiple wavelengths of light. Therefore, even when the pixels are optimized to respond primarily to IR light, the presence of other wavelengths influences the response of the pixels, making it difficult to interpret intensity of the IR light. Conversely, under some use scenarios, pixels may not receive sufficient IR irradiation to provide a meaningful reading. As a result, the accuracy or the range of applicability of the image sensors may be limited.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
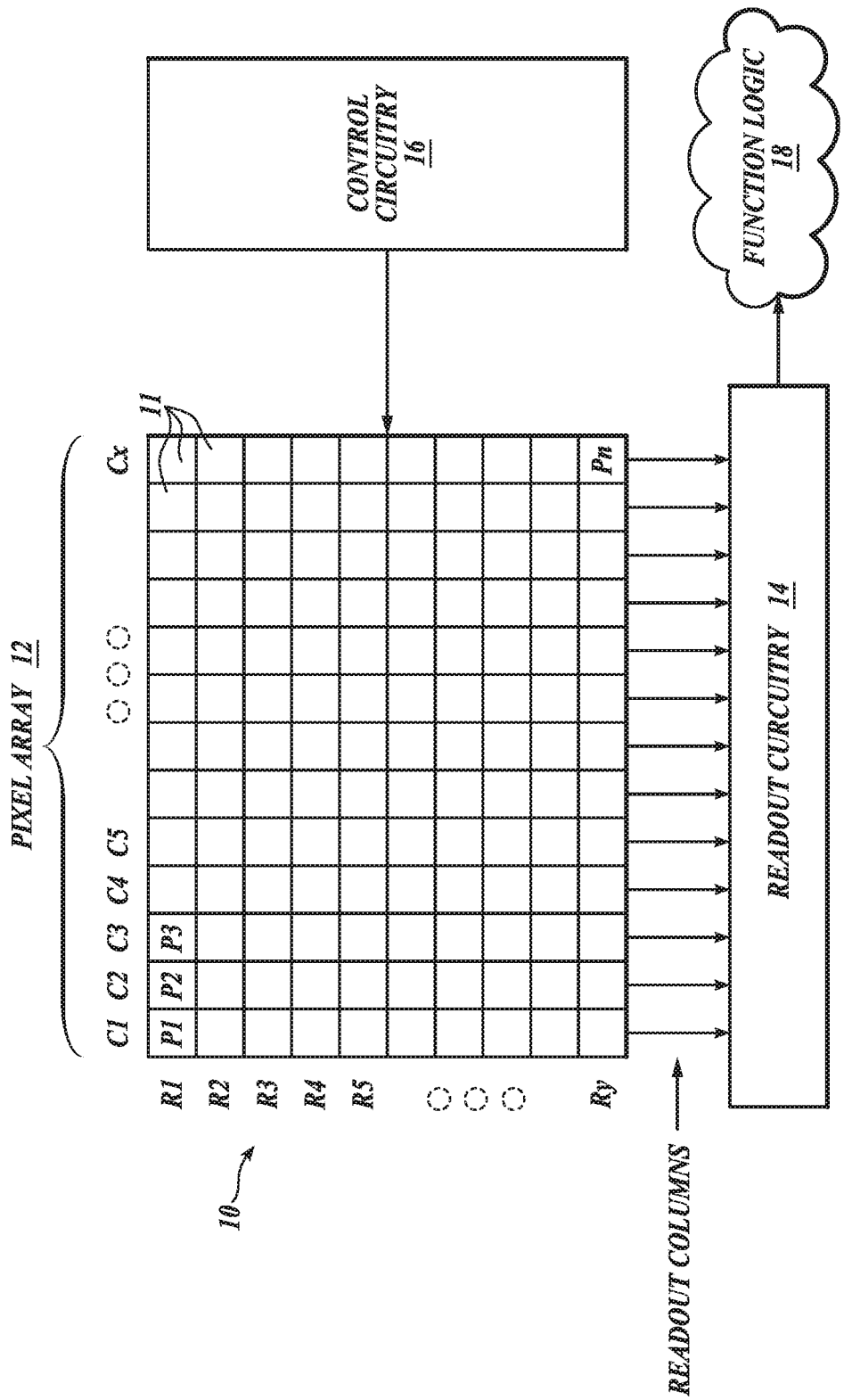
FIG. 1 is a diagram of an example image sensor in accordance with an embodiment of the present technology.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Image sensors, and in particular image sensors having improved sensitivity to IR light are disclosed. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (for example, rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Briefly, examples in accordance with the teachings of the present invention are directed to image sensor pixels (also referred to as channels) that have improved sensitivity to infrared light (e.g., increased quantum efficiency) and reduced inter-channel cross talk (e.g., improved channel separations). In some embodiments, the incoming light propagates toward the pixels through two layers of light filters: one layer having color bandpass filters (e.g., green, blue, red, or infrared bandpass) and the other layer having band-select filters (e.g., infrared (IR) pass, IR block, all-wavelengths block). In combination, the two layers of filters selectively expose the IR channels (pixels) to IR light, while filtering out the non-IR wavelengths. In some embodiments, IR channel can absorb the IR light from adjacent green channels.

In some embodiments, cell deep trench isolation (CDTI) microstructures are added to the semiconductor material of the IR pixel to improve capture of the IR light by directing light toward IR photodiodes, thus improving quantum efficiency (QE) of the IR channel. In some embodiments, CDTI microstructures may also be added to other channels, for example, to the semiconductor material of the adjacent green channel, to improve directing the light toward the IR pixel.

FIG. 1 is a diagram of an example image sensor 10 in accordance with an embodiment of the present technology. The image sensor 10 includes pixels 11 that are arranged in rows (R) and columns (C) of a pixel array 12. When the image sensor 10 is exposed to light, the individual pixels 11 acquire certain voltage values. After each pixel has acquired its voltage value, the image data is readout by a readout circuitry 14, and then transferred to a function logic 18.

Voltage values of the individual pixels ($P_1$-$P_n$) can be captured by the readout circuitry 14. For example, a control circuitry 16 may determine a specific row $R_i$ of the pixel array 12 for coupling with the readout circuitry 14. After the pixel values in row $R_i$ are captured, the control circuitry 16 may couple row $R_{i+1}$ with the readout circuitry 14, and the process repeats until voltage values of all the pixels in the column are captured. In other embodiments, the readout circuitry 14 may readout the image data using a variety of other techniques (not illustrated in FIG. 1), such as a serial readout or a full parallel readout of all pixels simultaneously.

In different embodiments, the readout circuitry 14 may include amplification circuitry, analog-to-digital conversion ("ADC") circuitry, or other circuitry. In some embodiments, the pixel values are captured and processed by a function logic 18. Such processing may, for example, include image processing, image filtering, image extraction and manipulation, determination of light intensity, etc.

Figure 2:
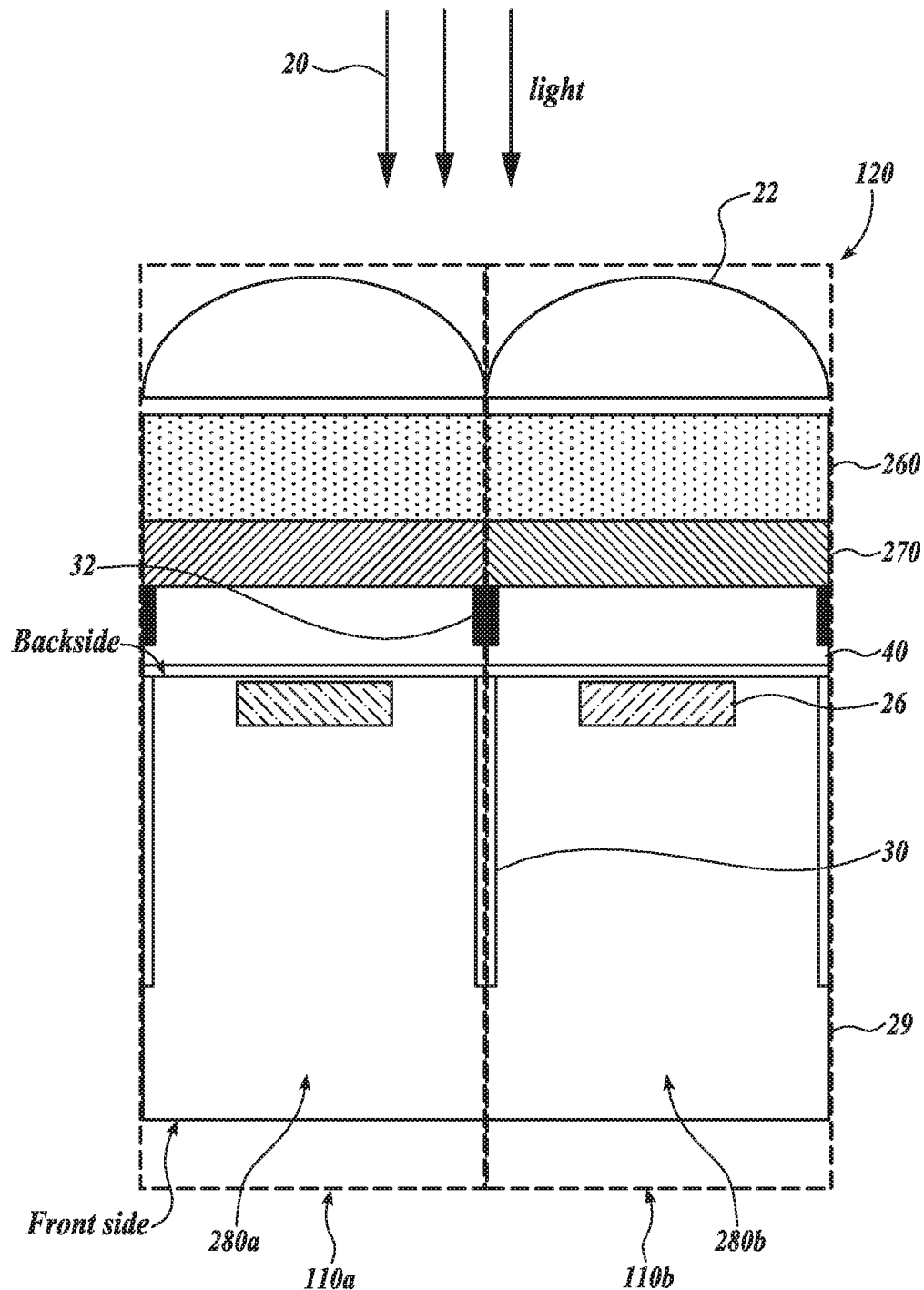
FIG. 2 is a cross-sectional view of example pixels in accordance with an embodiment of the present technology.

FIG. 2 is a cross-sectional view of example pixels in accordance with an embodiment of the present technology. For simplicity, two pixels 110a and 110b are illustrated, but in other embodiments the pixel array 120 may include larger numbers of pixels. The illustrated pixels 110a, 110b include photodiodes 280a, 280b, respectively, that are disposed in one or more layers of semiconductor material 29. In some embodiments, the photodiodes 280a, 280b may be n-type photodiodes formed in the semiconductor material 29, and the semiconductor material 29 may be a silicon substrate, doped silicon substrate, or a P-type epitaxial silicon substrate. However, in some embodiments, the polarity may be reversed, for example, the photodiodes 280a, 280b may be p-type photodiodes formed in the n-type semiconductor material 29 (e.g., n-type doped silicon substrate, or n-type epitaxial silicon substrate). In some embodiments, the adjacent photodiodes 280a, 280b are separated at least partially by a deep trench isolation 30, which may decrease signal crosstalk between adjacent photodiodes 280a, 280b.

In operation, the photodiodes 280a, 280b generate electrical charge in response to receiving incoming light 20. In some embodiments, the incoming light may propagate through a vertical stack having a micro-lens 22, a color filter layer 260, a light filter layer 270, a buffer oxide layer 40 with a plurality of metal grids 32, and cell deep trench isolation (CDTI) microstructures 26, before reaching the photodiodes 280a, 280b. The color filter 260 may include a plurality of color filters, such as red color filters, blue color filters, green color filters, and infrared (IR) color filters optically arranged for filtering incoming light 20 according to specific light wavelength. This vertical stack operates to filter the incoming light 20, and to direct the light toward the respective photodiodes 280a, 280b. As the filtered light reaches the photodiodes 280a, 280b, a corresponding electrical charge is generated and, at appropriate intervals, routed away from the pixel array 120, toward readout circuitry (e.g., readout circuitry 14 of FIG. 1). Buffer oxide layer 40 may include oxide material deposited on the backside of the semiconductor material 29, for example by chemical vapor deposition (CVD) process. Metal grid 32 may be formed between the adjacent pixels (photodiodes) in the buffer oxide layer 40 and may operatively direct filtered light to the respective photodiodes 280a, 280b through reflection and/or refraction, therefore preventing or at least reducing color crosstalk between photodiodes 280a, 280b.

Figure 3:
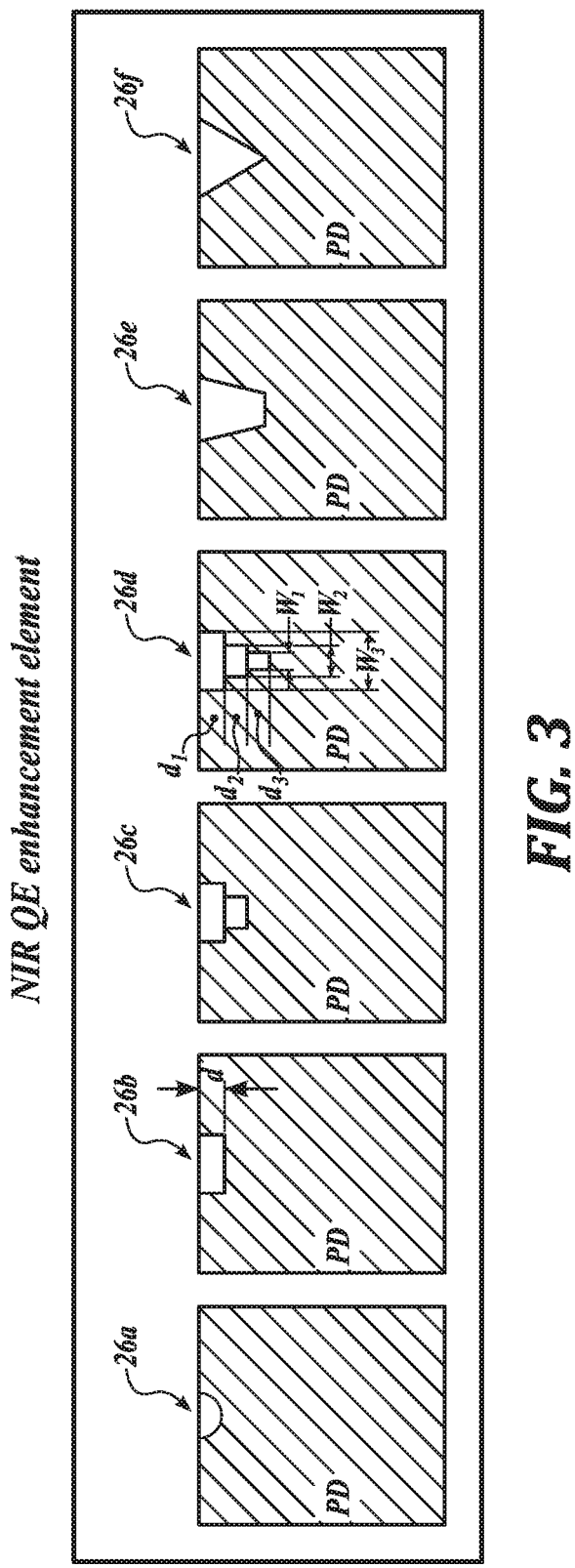
FIG. 3 shows cross-sectional views of example cell deep trench isolation (CDTI) microstructures in accordance with embodiments of the present technology.

FIG. 3 shows cross-sectional views of example CDTI microstructures 26 in accordance with embodiments of the present technology. These cross-sectional views correspond to the view shown in FIG. 2. FIG. 3 shows details of the CDTI microstructures 26. In the depicted embodiments, CDTI microstructures 26 are disposed in the photodiode (PD) 280 region in the path of incident light. CDTI microstructures 26 operatively alter the optical transmission path within the respective photodiode 280 through reflection, refraction and/or diffraction to enhance the light reception of the respective photodiode 280 to IR light having light wavelength ranging from 700-1000 nm. In different embodiments, the surface proximate to the CDTI microstructures 26 may be the front side surface of the photodiode (as depicted in FIG. 2) or may be the backside surface (if the incoming light enters from the direction opposite from that shown in FIG. 2).

In different embodiments, each of the CDTI microstructures 26a-26f includes a core dielectric material, which has a refractive index smaller than the refractive index of the semiconductor material. As one example, the semiconductor material is silicon. However, one skilled in the art will appreciate that any group III elements (B, Al, Ga, In, Tl), group IV elements (C, Si, Ge, Sn, Pb), group V elements (N, P, As, Sb, Bi), and suitable combinations of these elements, may be used to form the semiconductor material. In some examples, the core dielectric material may include oxides/nitrides such as silicon oxide ($SiO_2$), hafnium oxide ($HfO_2$), silicon nitride ($Si_3N_4$), silicon oxynitride ($SiO_xN_y$), tantalum oxide ($Ta_2O_5$), titanium oxide ($TiO_2$), zirconium oxide ($ZrO_2$), aluminum oxide ($Al_2O_3$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), yttrium oxide ($Y_2O_3$), or the like. Additionally, one skilled in the relevant art will recognize that other stoichiometric combinations of the above metals/semiconductors and their oxides/nitrides/oxynitrides may be used, if they have a refractive index smaller than the refractive index of the semiconductor material, in accordance with the teachings of the present technology.

Although not illustrated in FIG. 3, each of the CDTI microstructures 26 may also include a liner material disposed between the photodiode and the core dielectric material. In some embodiments, the liner material may include at least one of a negatively charged high-k dielectric material (e.g., dielectric material with a dielectric constant greater than 3.9), or a doped semiconductor material. For example, a trench could be etched, and boron, nitrogen, or arsenic could be implanted into the sidewalls of the trench to form a doped semiconductor material as the liner material. Alternatively, a trench could be etched and hafnium oxide could be deposited in the trench to form a negatively charged high-k liner material before the core dielectric material is deposited into the trench.

In different embodiments, CDTI microstructures 26 may have different shapes. Some examples of such shapes are a parallelepiped, a polygon (e.g., a triangle, a trapezoid, a rectangle in a cross-sectional view), polyhedron, cylinder, an ellipsoid, a hemispheroid, and a hemisphere. In some embodiments, CDTI microstructures 26 may include a stack of several geometrical shapes, for example, narrowing trenches shown as CDTI microstructures 26d. Other configurations are also possible, for example, combinations of the shapes shown as CDTI microstructures 26a-26f. In operation, CDTI microstructures 26 direct light toward the interior of the photodiodes.

Figure 4:
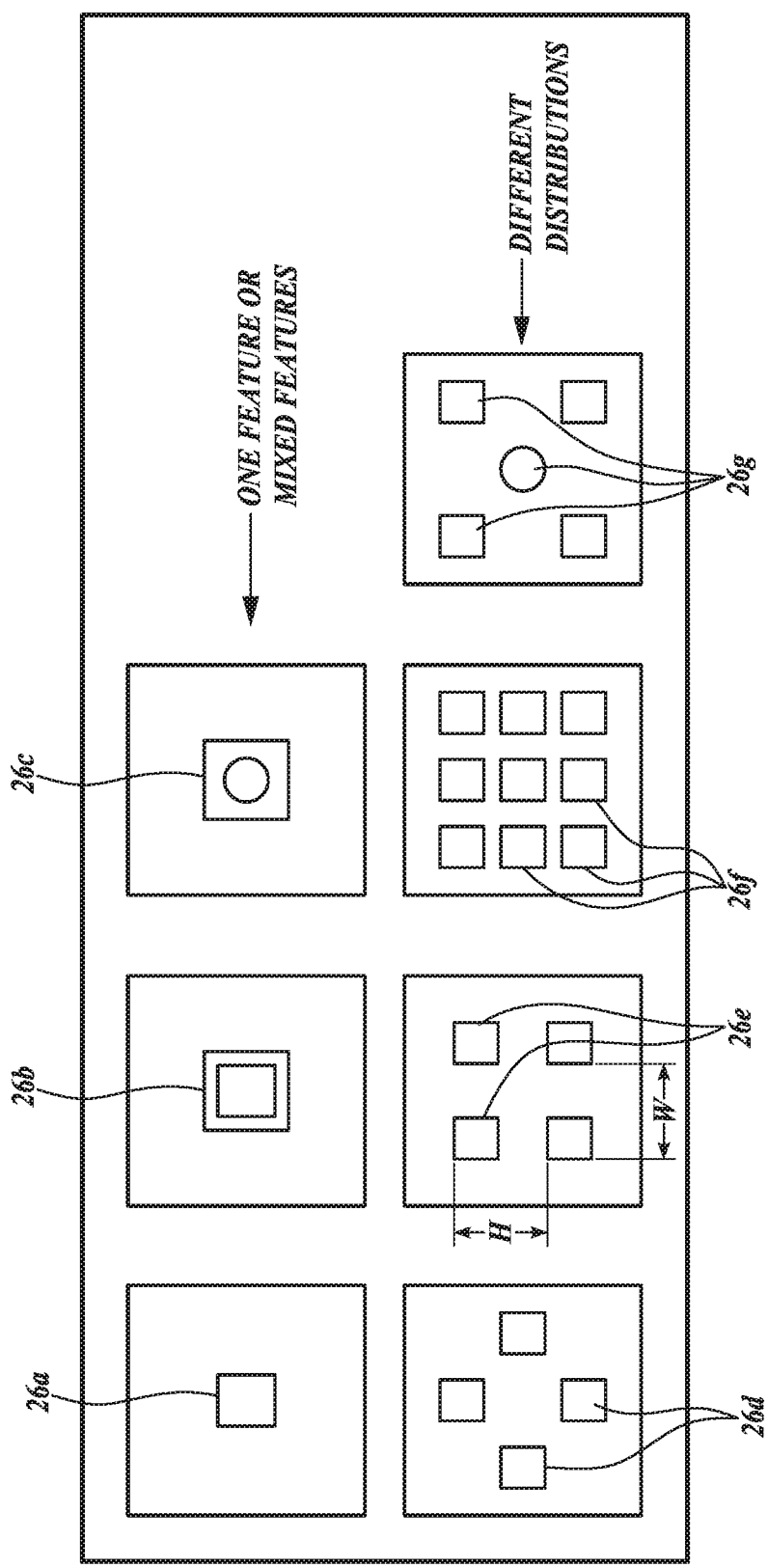
FIG. 4 shows top plan views of example CDTI microstructures in accordance with an embodiment of the present technology.

FIG. 4 shows top plan views of example CDTI microstructures arrangement in accordance with an embodiment of the present technology. In different embodiments, one CDTI microstructure ("feature") or multiple CDTI microstructures may be used for a given photodiode. For example, CDTI microstructure 26a includes a single rectangular feature, whereas CDTI microstructure 26b includes nested rectangular features, and CDTI microstructure 26c includes nested rectangular and circular features.

In different embodiments, CDTI microstructures 26 may be arranged in different spatial distributions. For example, rectangular CDTI microstructures 26d, 26e, and 26f may be arranged into different arrays with structure-to-structure distances H, W. The spatial arrangement of microstructures 26, and associated spacing H, W may be configured based on desired quantum efficiency associated with specific light wavelength for the respective photodiode. As another non-limiting example, CDTI microstructure 26g includes the microstructures having different shapes within a common array. Other distributions of CDTI microstructures 26 are also possible by, for example, combining the microstructures shown in FIG. 4.

Figure 5A:
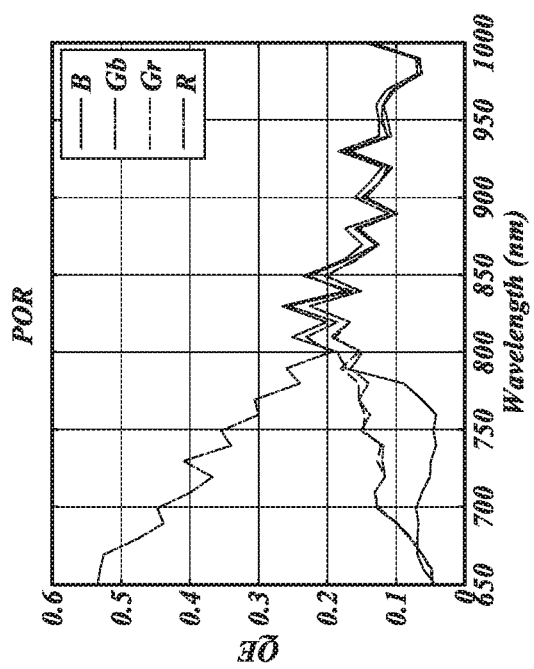
FIGS. 5A-5C are example graphs of quantum efficiency (QE) for the channels in accordance with an embodiment of the present technology.
Figure 5B:
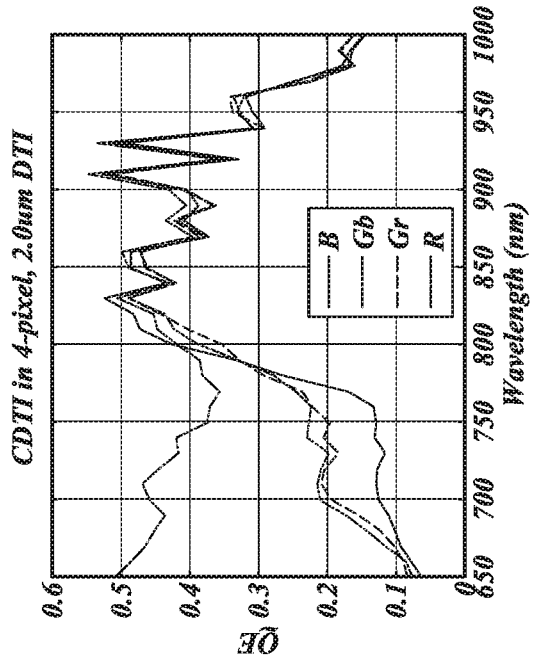
Figure 5C:
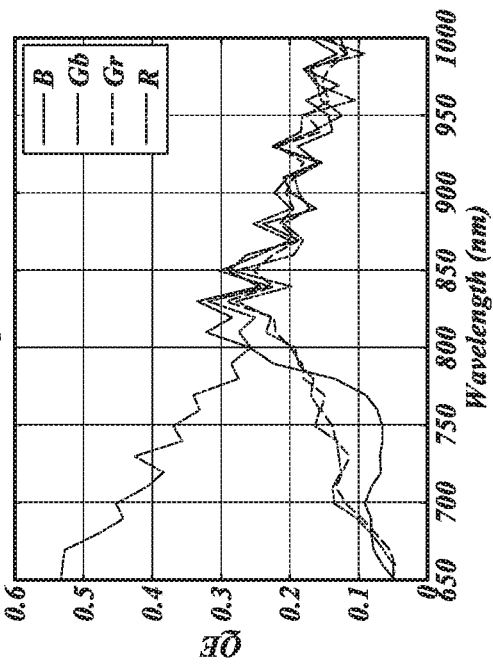

FIGS. 5A-5C are example graphs of quantum efficiency (QE) for the channels in accordance with an embodiment of the present technology. The horizontal axes of the graphs show the wavelength of the incoming light in nanometers. The vertical axes show quantum efficiency (QE) of the pixels (channels) in the Bayer pattern (B, Gb, Gr, R). The illustrated pattern includes pixels at 1.4 µm pitch without CDTI (FIG. 5A), CDTI in four pixels (FIG. 5B) and CDTI in one pixel (FIG. 5C). The infrared (IR) spectrum is generally considered to extend from about 700 nm to about 1000 nm or to correspond to a wavelength band centered at about 850 nm. Generally, a higher QE is preferred for higher sensitivity of the pixel to the corresponding light wavelength associated with the color and IR channels. However, pixels in a pixel array should also preferably have different QE's for different wavelengths of the incoming light for improved differentiation.

Turning attention now to FIG. 5A, QE ranges from about 10% to 20% for all channels arranged in the Bayer pattern within the IR spectrum (e.g., close to 850 nm). This level of QE may be insufficient for high performance (e.g., high sensitivity) channels. Furthermore, since all channels have similar QE within the IR spectrum, the illustrated pixel array may not be suitable to judge visible light information, because the non-IR pixels would have comparable response to those of the IR pixels.

Turning attention now to FIG. 5B, QE ranges from about 40% to 50% for all channels arranged in the Bayer pattern for the IR spectrum (e.g., close to 850 nm). In some embodiments, the increased level of QE in comparison to FIG. 5A is caused by the CDTI microstructures that direct more light toward the respective photodiodes of the pixels (channels). In some embodiments, this level of QE may be considered sufficient for high performance channels. However, all the channels are still characterized by comparable QE, therefore the pixel array may not be suitable for sensing the IR spectrum, similarly to the scenario described in conjunction with FIG. 5A.

Turning attention now to FIG. 5C, QE ranges from about 10% to 30% for all channels in the Bayer pattern within the IR spectrum. The illustrated 1-pixel array includes just one CDTI microstructure in one color channel, in comparison with 4-pixel array with four CDTI microstructures in all 4 color channels (i.e., one CDTI microstructure per pixel) shown in FIG. 5B. The values of QE generally fall between those of the FIG. 5A and FIG. 5B for the same wavelength. However, the four pixels are still characterized by comparable QE, without significant differentiation within the IR spectrum.

The above-described comparable levels of QE may indicate strong inter-pixel crosstalk. Some embodiments of light filtering that improve QE differentiation of the pixels in the IR spectrum are described with reference to FIGS. 6A-7B below.

Figure 6A:
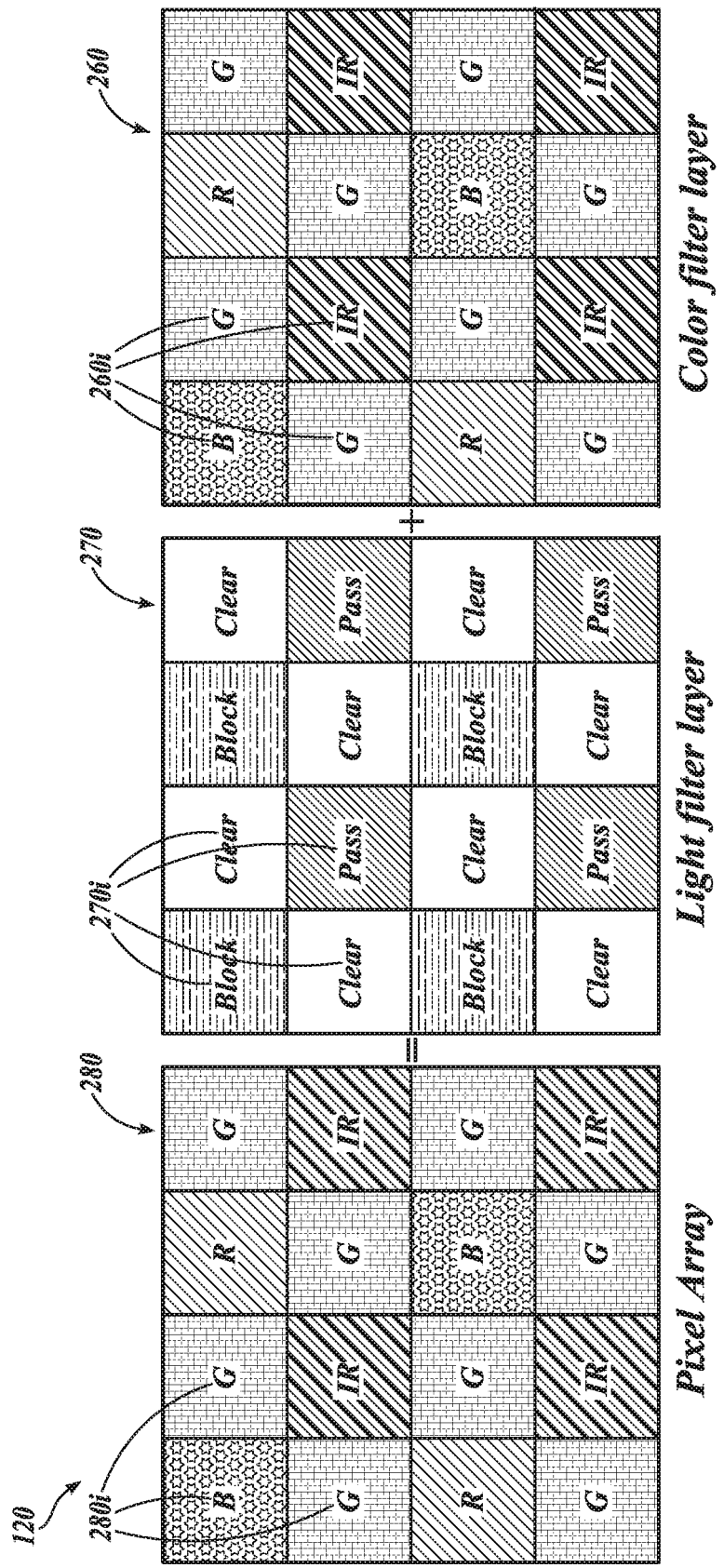
FIG. 6A is a diagram of example layers of an image sensor in accordance with an embodiment of the present technology.
Figure 6B:
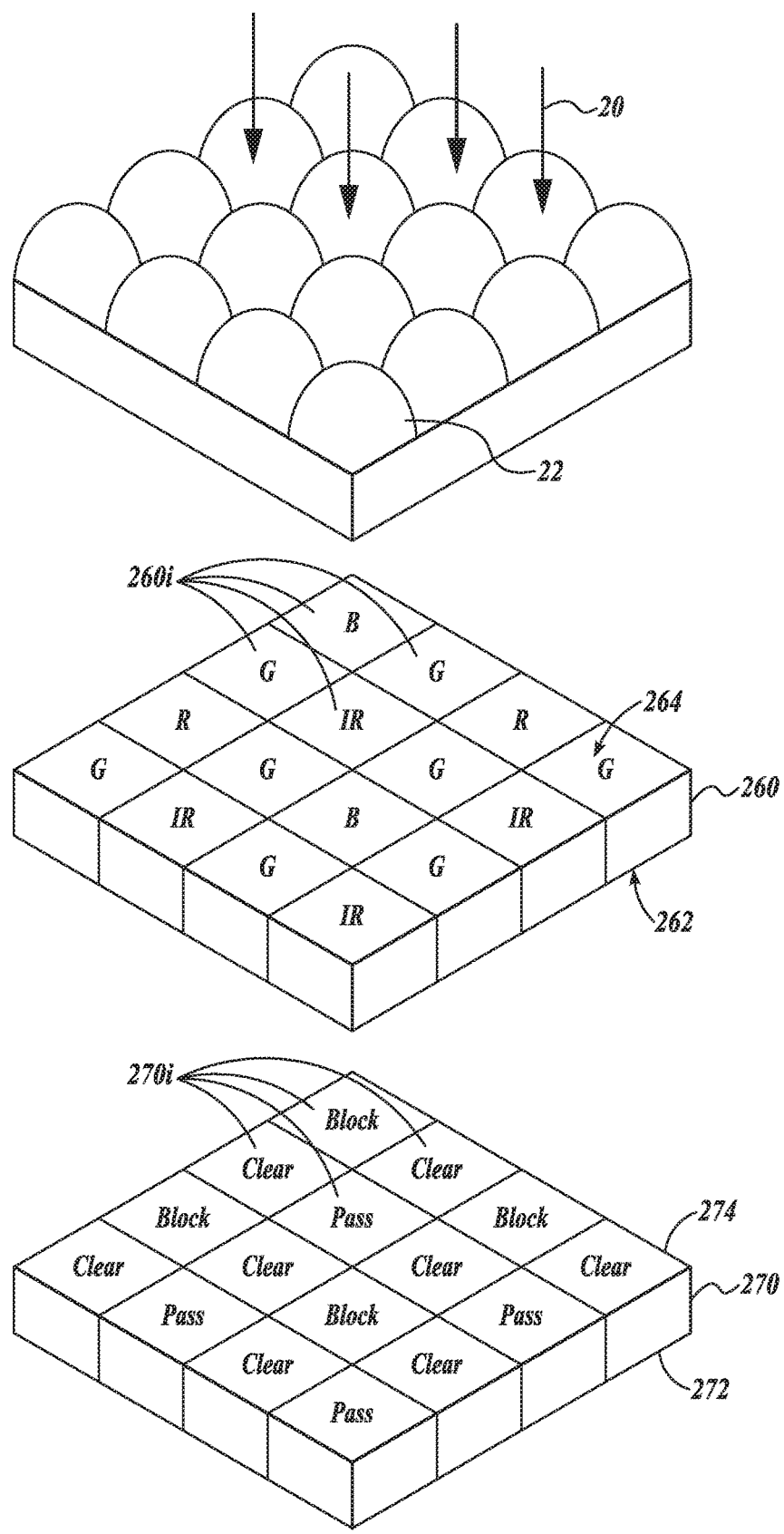
FIG. 6B shows a partially exploded perspective view of the image sensor in accordance with an embodiment of the present technology.

FIG. 6A is a diagram of example layers of the image sensor in accordance with an embodiment of the present technology. FIG. 6B shows a perspective view of the image sensor in accordance with an embodiment of the present technology. In some embodiments, a pixel array 120 includes the plurality of photodiodes 280, a color filter layer 260 stacked over a light filter layer 270, which, in turn, is stacked over the plurality of photodiodes 280. A micro-lens 22, a color filter 260i, a light filter 270i and the respective photodiode 280i may collectively form a unit pixel (e.g., pixel 11 of FIG. 1).

In some embodiments, the light filter layer 270 has a first side 272 facing the plurality of photodiodes 280 and a second side 274 facing away from the first side 272. The color filter layer 260 has a first surface 262 facing the second side 274 of the light filter layer 270, and a second surface 264 facing away from the first side 272 of the light filter layer 270. In other words, the color filter layer 260 is formed on the second side 274 of the of the light filter layer 270. A plurality of micro-lenses 22 is disposed proximate to the second surface 264 of the color filter layer 270 and direct incoming light 20 to the respective photodiode 280i.

In operation, the incoming light 20 propagates through the color filter layer 260 and through the light filter layer 270 before reaching the photodiodes 280. In some embodiments, individual fields (areas) 260i of the color filter layer 260 and individual fields (areas) 270i of the light filter layer 270 generally correspond to the individual photodiodes 280i. In other embodiments, the individual fields of the color filter layer 260 and/or the light filter layer 270 may cover multiple individual photodiodes 280i.

In some embodiments, the distribution of the color filters 260i (e.g., blue (B), green (G), read (R), infrared (IR)) corresponds to photodiodes 280i of the photodiodes layer 280. Each photodiode 280i operatively generates charges corresponding to the absorption of particular wavelength being filtered by the respective color filter. The color filters 260i may be arranged according to a specific color pattern, such as Bayer pattern or mosaic of red, green, blue and IR filters (e.g., B, G, G, IR or R G, G, IR), to transmit blue light, green light, red light, and IR light accordingly. As the incoming light 20 passes through the color filter layer 260, the individual color fields or regions of the color filters 260i pass the light within a specific wavelength bandwidth (e.g., B, G, R, IR), while predominantly rejecting other wavelengths. Incoming light 20 further propagates through the light filter layer 270. Here, the fields 270i may be configured to operate as a band-reject filter and block IR wavelengths ("Block"), bandpass filter and pass all the wavelengths ("Clear"), or bandpass filter but pass just the IR wavelengths ("Pass") while rejecting light in the visible spectrum. Alternatively stated, each of the individual fields 270i in the light filter layer 270 is operable to further selectively filter light wavelength (e.g., to pass or reject specific range of light wavelengths through) after the incoming light 20 has being filtered by the respective individual color fields or regions of the color filters.

Analyzing, for example, path of light corresponding to the photodiode 280i associated with IR filter (referred as IR photodiode) in the upper left segment (row 2, column 2), the corresponding color filter 260i ("IR") passes the incoming IR light toward the light filter layer 270, which then passes all the infrared light for that area by the "Pass" light filter toward corresponding photodiode 280i. As a result, the IR illumination of the IR photodiode 280i in the upper left corner is maximized. Furthermore, analyzing, for example, path of light corresponding to the photodiode 280i associated with blue color filter (referred as blue photodiode) in upper left corner (row 1, column 1), the corresponding color filter 260i ("B") passes the incoming blue light toward the light filter layer 270, which then blocks the infrared light while passing visible light (e.g., blue light) for that area by the "Block" light filter. As a result, the corresponding blue photodiode 280i has a relative limited QE, and also contributes relatively limited IR irradiation to the adjacent diagonally positioned IR photodiode 280i. Furthermore, analyzing path of light for either of the photodiodes 280i associated with green color filter (referred as green photodiodes) in the upper row of the photodiode layer (row 1, columns 2 or 4), the corresponding color filter 260i ("G") passes the incoming green light toward the light filter layer 270, which passes all the wavelengths for that area by "Clear" light filter. As a result, the corresponding G photodiode 280i will have a relatively high QE. Furthermore, the laterally adjacent IR photodiode 280i may receive additional irradiation that increases its QE for the IR wavelengths, as explained below.

The "Block" light filter of the light filter layer 270 is an IR reject filter that operates to reject infrared light, such as light with wavelength greater than 850 nm. The "Block" light filter of the light filter layer 270 may be implemented by a band-reject filter. In one embodiment, the band-reject filter may be formed from materials that block IR lights while passing visible lights. The "Pass" light filter of the light filter layer 270 may be implemented by a bandpass filter that allows infrared light, such as light with wavelength greater than 850 nm, to pass through the respective photodiodes 280i, for example the photodiode 280i for IR pixel (channel). In one embodiment, the bandpass filter may be formed from materials that pass IR light while blocking light in visible spectrum. The "Clear" light filter of the light filter layer 270 may be formed by a clear or transparent material and be operative to allow all light, e.g., visible and infrared light, to pass through toward the respective photodiodes 280i, for example, the green pixels (channels). Those skilled in art will understand the selection of materials and processes to form the light filter layer 270 that includes "Block" light filter for blocking IR light, "Pass" light filter for passing IR light, and "Clear" light filter for passing all light. Therefore, some details are omitted for conciseness and brevity of description.

In some embodiments, the "Pass" light filter may be arranged to be between the ("IR") color filter 260i (IR color filter) and the corresponding photodiode 280i (IR channel). The "Pass" light filter may be surrounded by the "Clear" light filter. In some embodiments, the ("G") color filter 260i is disposed proximate to a lateral side of the ("IR") color filter 260i (IR color filter) and the "Clear" light filter is arranged to be between the ("G") color filter 260i (G color filter) and the corresponding photodiode 280i (G channel). In some embodiments, the ("B") color filter 260i is disposed diagonally with respect to the ("IR") color filter 260i (IR color filter) and the "Block" light filter is arranged to be between the ("B") color filter 260i (G color filter) and the corresponding photodiode 280i (B channel). In some embodiments, the ("R") color filter 260i is disposed diagonally with respect to the ("IR") color filter 260i (IR color filter) and the "Block" light filter is arranged to be between the ("R") color filter 260i (G color filter) and the corresponding photodiode 280i (R channel).

FIGS. 7A-7D are graphs of quantum efficiency (QE) for the channels in accordance with an embodiment of the present technology. The horizontal axis in each graph shows light wavelength in nanometers, and the vertical axis shows QE. A dash line box in each graph marks a wavelength band of interest within overall IR spectrum.

Figure 7A:
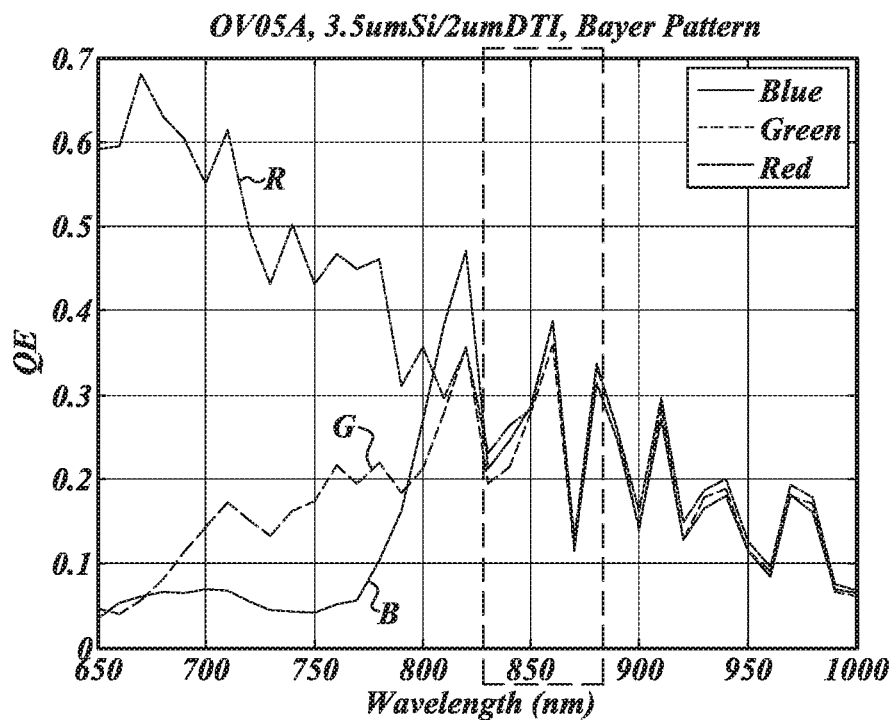
FIGS. 7A-7D are example graphs of quantum efficiency (QE) of an image sensor in accordance with an embodiment of the present technology.

FIG. 7A shows QE for a Bayer arrangement of pixels (channels) without the CDTI or filter layers being used. At the wavelength of about 850 nm, QE is about 25% for all pixels. In many applications, such level of QE would be considered insufficient and/or insufficiently differentiated.

Figure 7B:
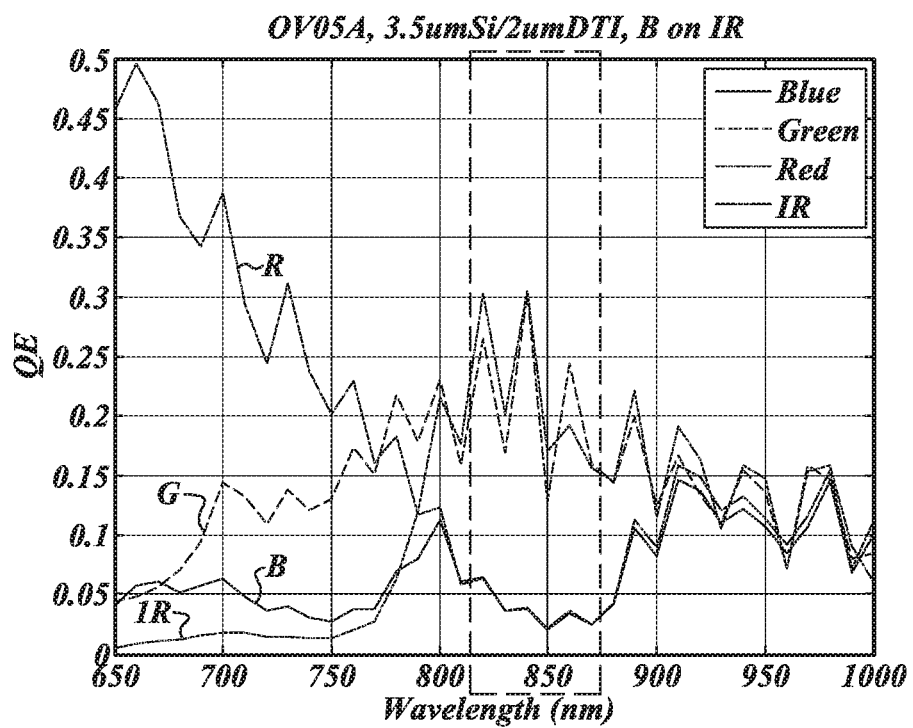

FIG. 7B shows QE for an arrangement of pixels that includes the color filter layer 260 and the light filter layer 270 shown in FIG. 6. The blue and red channels have relatively low QE of about 3% at 850 nm, while the green and IR channels have higher QE of about 20% within the wavelength band of interest at about 850 nm. Therefore, channel separation may be considered adequate, but the absolute value of the QE for the IR channel may be too low for some applications.

Figure 7C:
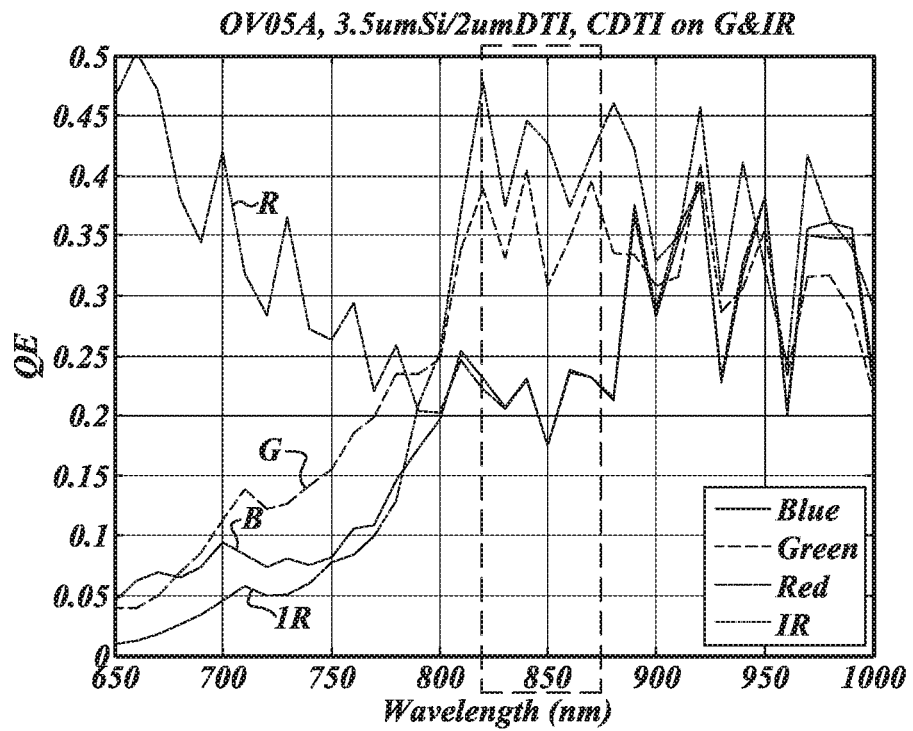

FIG. 7C shows QE for an arrangement of pixels that, in addition to the color filter layer 260 and the light filter layer 270 shown in FIG. 6, includes CDTI microstructures over the green and IR photodiodes. In this case, the blue and red channels have higher QE of about 20% at 850 nm, while the green and IR channels have QE of about 35-40% for the range of wavelengths at about 850 nm. Therefore, absolute value of the QE for the IR channel may be sufficient for some applications. However, channel separation between the blue and red channels on one side and the green and IR channels on the other side may be insufficient for some applications. Stated differently, the blue and red channels may have too high QE in comparison to the green and IR channels for adequate channel separation.

Figure 7D:
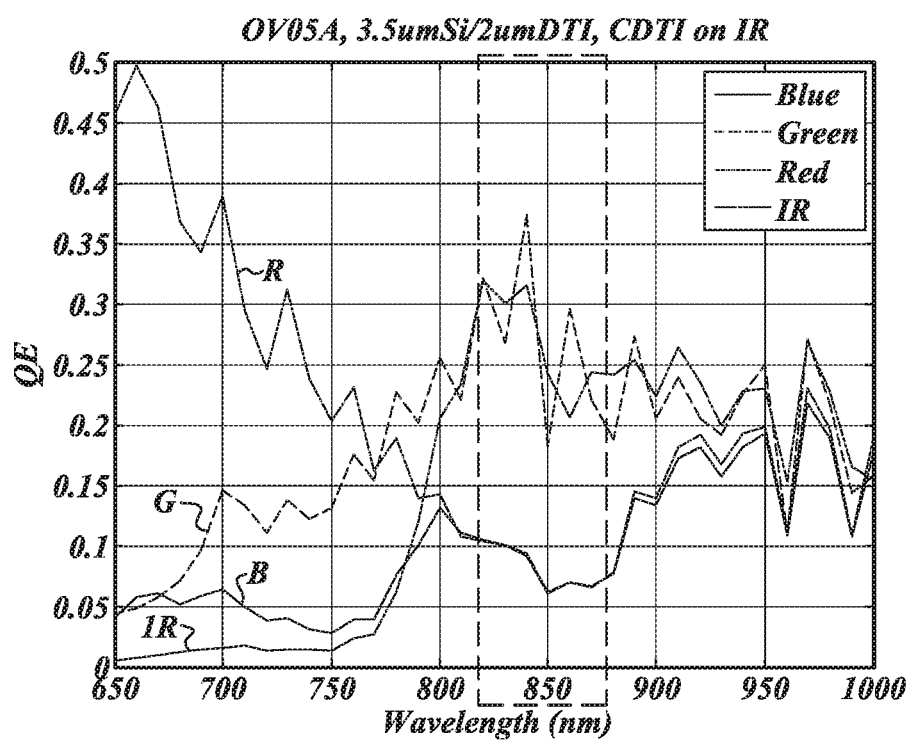

FIG. 7D shows QE for an arrangement of pixels that, in addition to the color filter layer 260 and the light filter layer 270 shown in FIG. 6, includes CDTI microstructures disposed within the IR photodiode region. In this case, all channels have somewhat lower QE in comparison to that shown in FIG. 7D. This result may be attributable to the lack of the CDTI structures over the green channels. As a result, QE of the red and blue channels is about 7% at 850 nm, while the green and IR channels have the QE of about 25-30% close to 850 nm. In some application, the channel separation may be defined as the QE for the blue and red channels being less than 10% of the QE for the IR channel at 850 nm. Therefore, the channel separation between the blue and red channels on one side, and the green and IR channels on the other side may be sufficient (being at about 1:3 ratio), while the absolute value of the QE for the IR channel (25-30%) may also be adequate for some applications. In many embodiments, the IR or NIR image sensor should meet both of these requirements—the absolute value of the QE for the IR channel as well as the channel separation requirements. Some combinations of the CDTI patterns, and color and light filters are described with reference to FIGS. 8A-13B below.

Figure 8A:
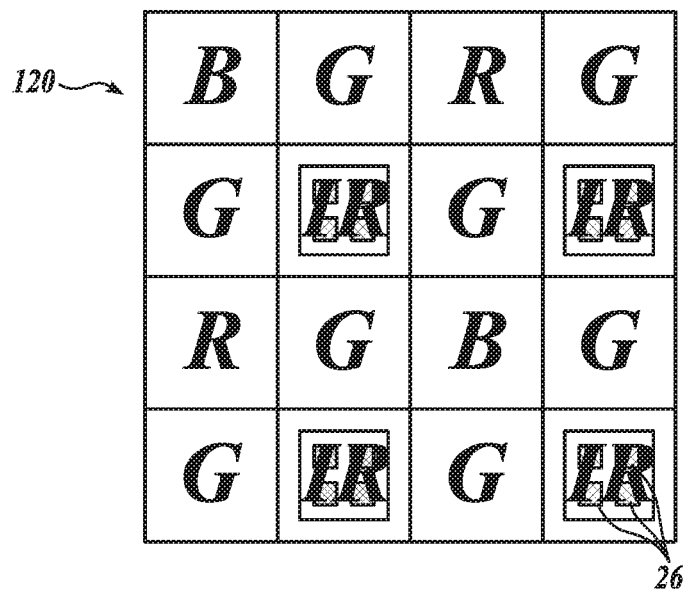
FIG. 8A is a diagram of an example image sensor in accordance with an embodiment of the present technology.

FIG. 8A is a diagram of an example of the image sensor 120 in accordance with an embodiment of the present technology. The illustrated image sensor 120 includes CDTI microstructures 26 disposed within the photodiode for the IR channel to redistribute light within the photodiode region to improve IR sensitivity. The illustrated embodiment may include a square-shaped CDTI microstructures array pattern, but other patterns are also possible. In the illustrated embodiments, a squared-shaped CDTI microstructures 26 may in one cross-sectional view have a square-shaped structure. The square-shaped CDTI microstructures 26 may be arranged with equal spacing within the respective photodiode. In some embodiments, the illustrated image sensor 120 may also include the color filter layer 260 and the light filter layer 270 as shown, for example, in FIG. 6.

Figure 8B:
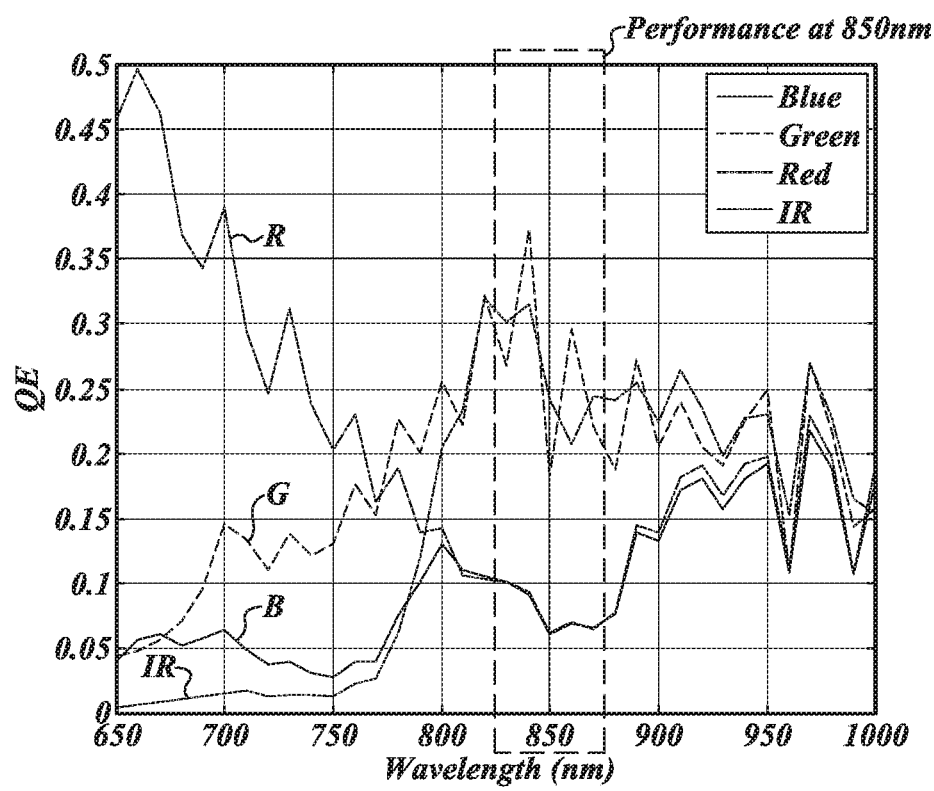
FIG. 8B is an example graph of quantum efficiency (QE) for the image sensor shown in FIG. 8A.

FIG. 8B is a graph of quantum efficiency (QE) for the image sensor shown in FIG. 8A. For the illustrated embodiment, the blue and red channels have QE of about 7% at 850 nm, while the green and IR channels have the QE of about 25-30% within the spectrum of interest of that is close to 850 nm. Therefore, for some applications, there may be sufficient absolute value of the QE for the IR channel as well as the channel separation between the blue and red channels on one side, and the green and IR channels on the other side.

Figure 9A:
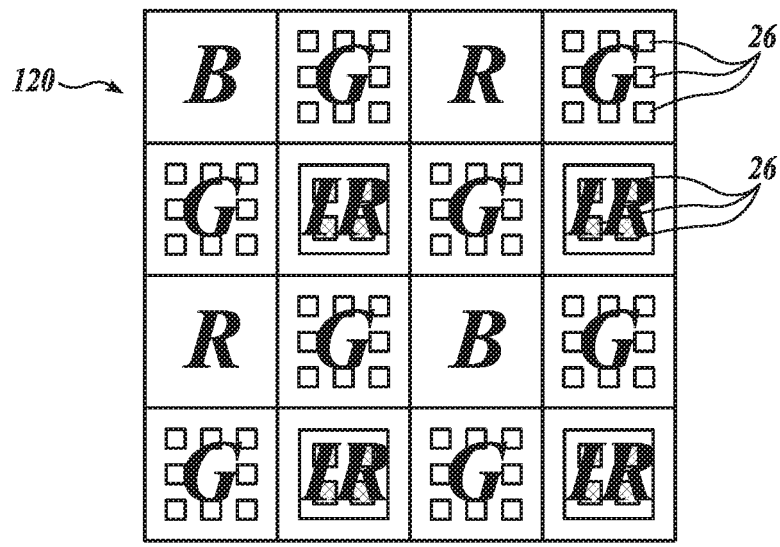
FIG. 9A is a diagram of another example image sensor in accordance with an embodiment of the present technology.

FIG. 9A is a diagram of another example of the image sensor 120 in accordance with an embodiment of the present technology. The illustrated image sensor 120 includes CDTI microstructures 26 disposed within the photodiode for the IR channels and the green channels to redistribute light within the photodiode regions for IR channels and direct light in neighboring green channels toward the IR channels by diffraction, reflection and/or refraction to improve IR sensitivity. Without being bound to theory, it is believed that the additional CDTI microstructure patterns over the green or G channels may direct additional light toward the adjacent sides of the IR channel into the IR photodiodes. The illustrated embodiment includes a square-shaped CDTI array pattern having 8 squares, but other patterns are also possible depend upon the pixel size and spacing between the square-shaped CDTI microstructures 26 for desired quantum efficiency for the respective pixel. In some embodiments, the illustrated image sensor 120 may also include the color filter layer 260 and the light filter layer 270 as shown, for example, in FIG. 6.

Figure 9B:
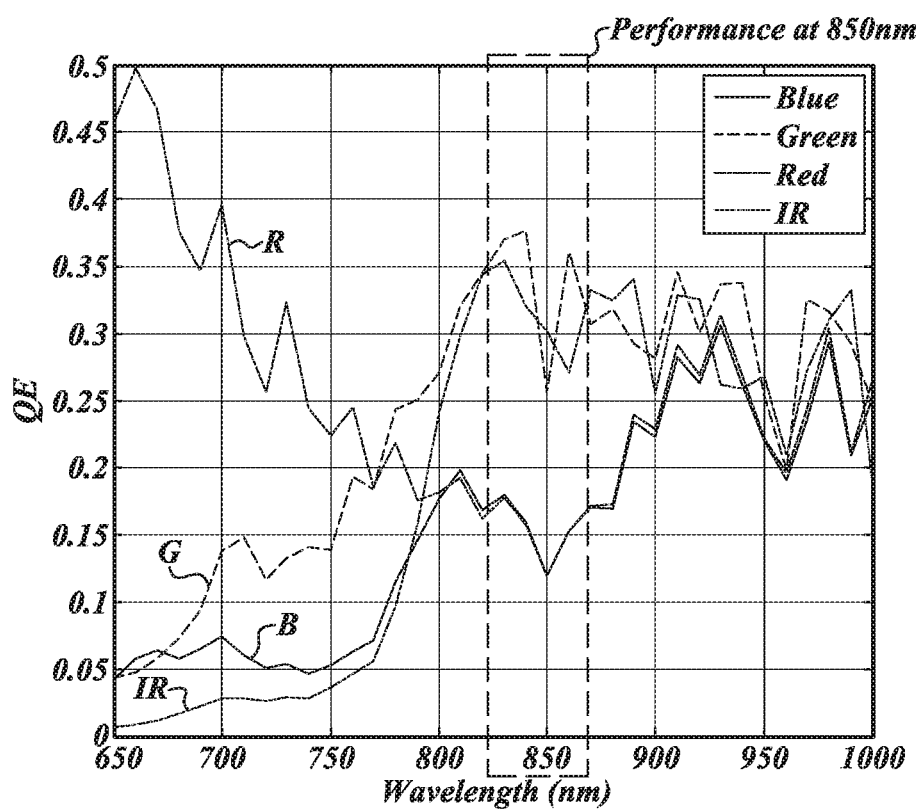
FIG. 9B is an example graph of quantum efficiency (QE) for the image sensor shown in FIG. 9A.

FIG. 9B is a graph of quantum efficiency (QE) for the image sensor shown in FIG. 9A. For the illustrated embodiment, the blue and red channels have QE of about 13% at 850 nm, while the green and IR channels have the QE of about 30% within the spectrum of interest of that is close to 850 nm. Therefore, both the absolute value of the QE for the IR channel (about 30%) and the channel separation between the blue and red channels on one side, and the green and IR channels on the other side (being higher than about 10%) may be sufficient for some applications.

Figure 10A:
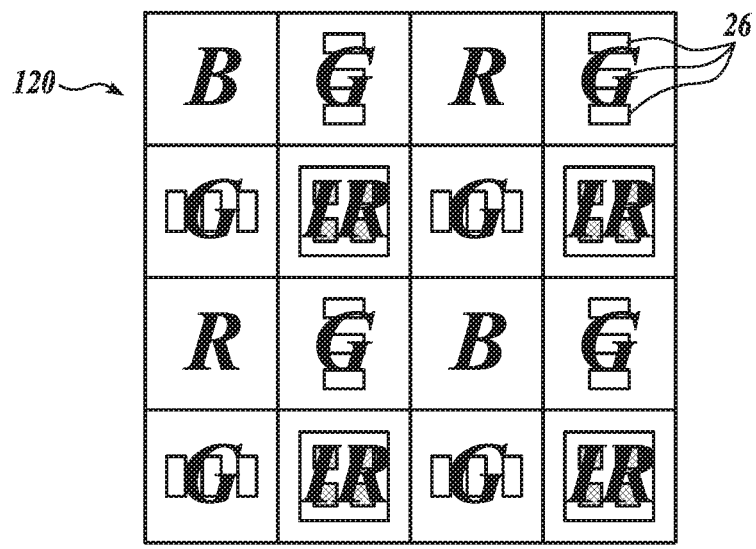
FIG. 10A is a diagram of yet another example image sensor in accordance with an embodiment of the present technology.

FIG. 10A is a diagram of yet another example of the image sensor 120 in accordance with an embodiment of the present technology. The illustrated image sensor 120 includes CDTI microstructures 26 within respective photodiodes associated with the IR channels and the G channels. The illustrated embodiment includes square-shaped CDTI microstructures pattern of the IR channels, and strip-shaped patterns over the green channels. In some embodiments, the illustrated image sensor 120 may also include the color filter layer 260 and the light filter layer 270.

Figure 10B:
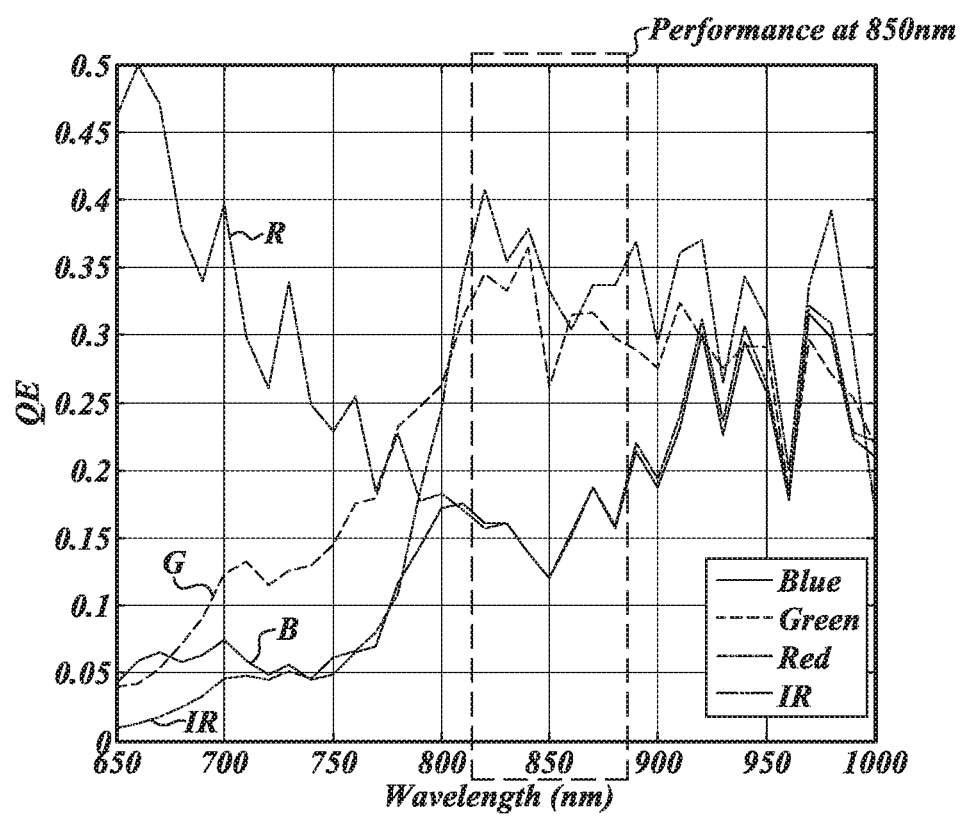
FIG. 10B is an example graph of quantum efficiency (QE) for the image sensor shown in FIG. 10A.

FIG. 10B is a graph of quantum efficiency (QE) for the image sensor shown in FIG. 10A. For the illustrated embodiment, the blue and red channels have QE of about 13% at 850 nm, while the green and IR channels have the QE of about 32% within the spectrum of interest of that is close to 850 nm. Therefore, both the absolute value of the QE for the IR channel and the channel separation between the blue and red channels on one side and the green and IR channels on the other side may be sufficient for some applications.

Figure 11A:
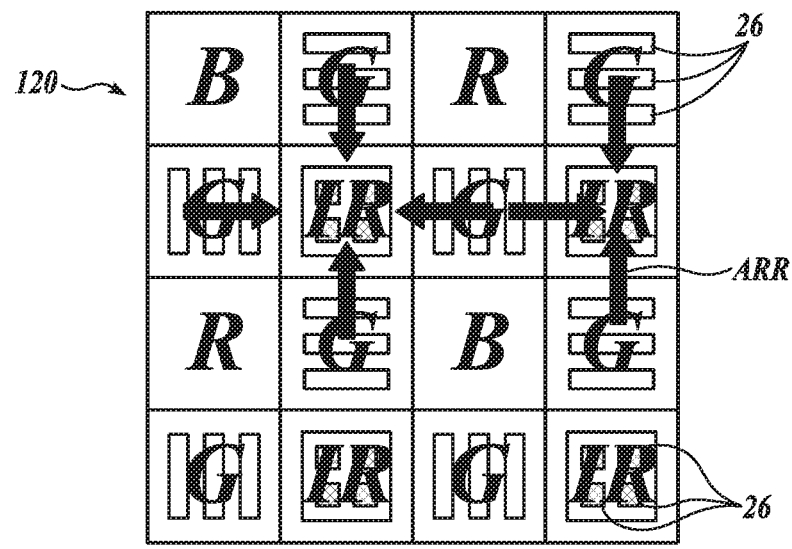
FIG. 11A is a diagram of still another example image sensor in accordance with an embodiment of the present technology.

FIG. 11A is a diagram of still another example of the image sensor 120 in accordance with an embodiment of the present technology. The illustrated image sensor 120 includes CDTI microstructures 26 within the respective photodiode associated with the IR channels and the G channels. The illustrated embodiment includes square-shaped CDTI microstructures pattern over the IR channels, and strip-shaped CDTI pattern over the green channels. The strip-shaped CDTI pattern in FIG. 11A is longer than the strip-shaped CDTI pattern shown in FIG. 10A. The strip-shaped CDTI microstructures 26 may be arranged and configured to direct light in adjacent green channels toward IR channel to enhance IR sensitivity of the IR channel. Without being bound to theory, it is believed that these longer CDTI patterns may direct more incoming light toward the IR channels, as indicated by arrows ARR. In some embodiments, the illustrated image sensor 120 may also include the color filter layer 260 and the light filter layer 270.

Figure 11B:
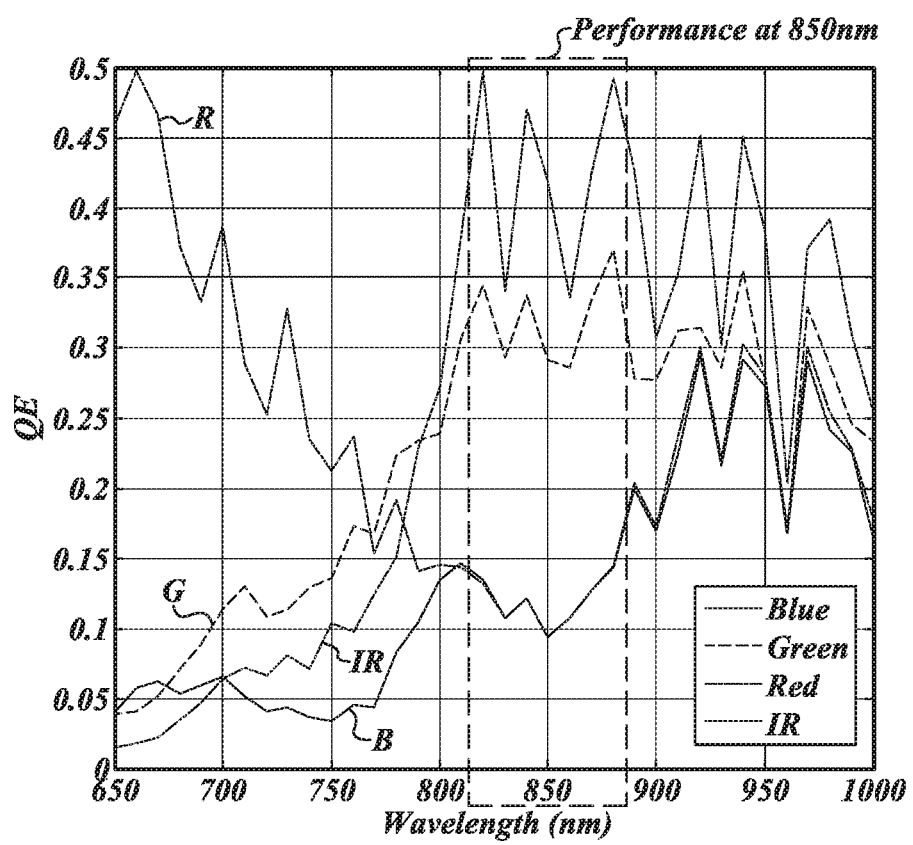
FIG. 11B is an example graph of quantum efficiency (QE) for the image sensor shown in FIG. 11A.

FIG. 11B is a graph of quantum efficiency (QE) for the image sensor shown in FIG. 11A. For the illustrated embodiment that has longer strip-shaped CDTI microstructures pattern, the blue and red channels have QE of about 10% at 850 nm, which is smaller QE than the one shown in FIG. 10B. In at least some embodiments, it may be beneficial to reduce the QE of the blue and red channels. The IR channel has the QE of about 40% within the spectrum of interest of that is close to 850 nm. Therefore, both the absolute value of the QE for the IR channel and the channel separation between the blue and red channels on one side, and the IR channel on the other side may be sufficient for some applications.

Figure 12A:
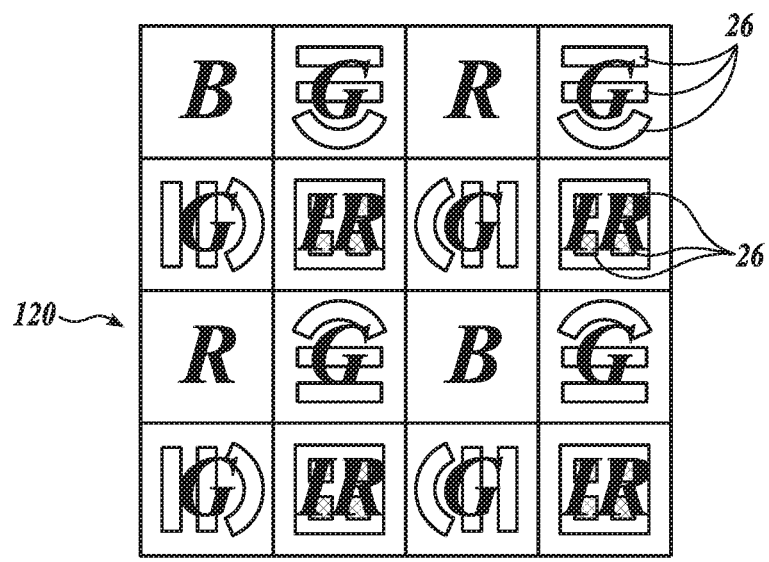
FIG. 12A is a diagram of yet another example image sensor in accordance with an embodiment of the present technology.

FIG. 12A is a diagram of yet another example of the image sensor 120 in accordance with an embodiment of the present technology. The illustrated image sensor 120 includes the CDTI microstructures 26 over the IR channels and the green channels. The illustrated embodiment includes square-shaped CDTI pattern of the IR channels. The CDTI microstructures pattern arranged within the photodiodes associated with the green channels being adjacent to the IR channels includes both the strips and arcs (or curved microstructure) to direct the light from neighboring green channels toward IR channels so as to increase IR sensitivity. The curvature of the arcs or curved microstructure may be configured based on the desired light guiding needs, for example amount of light directed from the green channels to IR channels. In some embodiments, the illustrated image sensor 120 may also include the color filter layer 260 and the light filter layer 270.

Figure 12B:
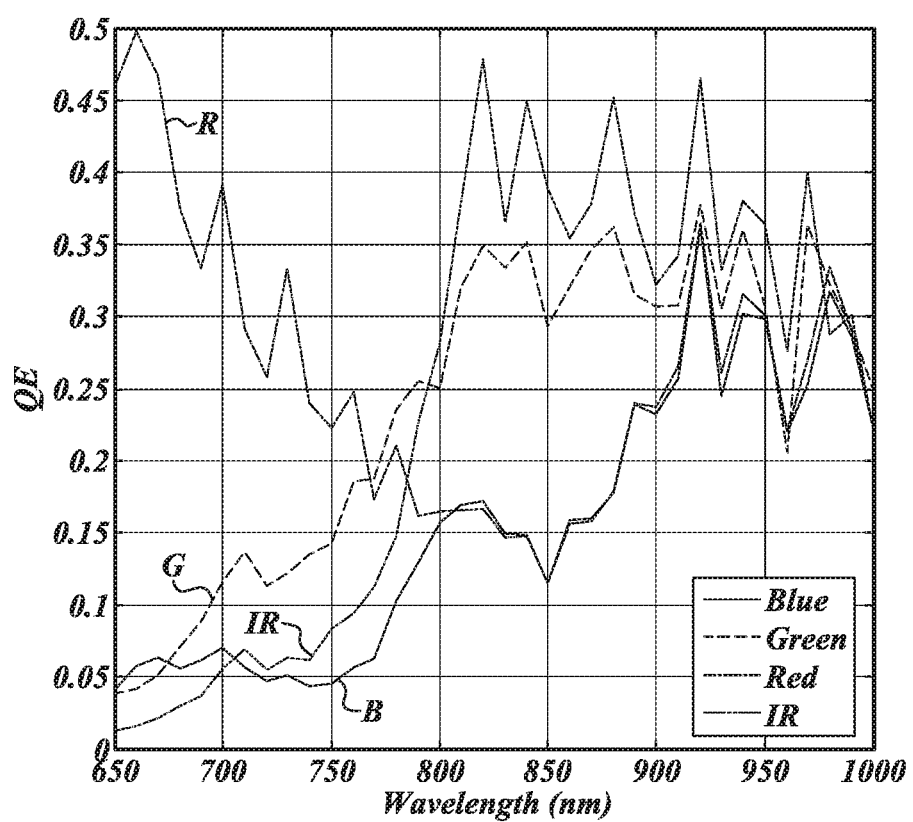
FIG. 12B is an example graph of quantum efficiency (QE) for the image sensor shown in FIG. 12A.

FIG. 12B is a graph of quantum efficiency (QE) for the image sensor shown in FIG. 12A. Here, the blue and red channels have QE of about 12% at 850 nm, which is somewhat higher than the one shown in FIG. 11B. The IR channel has the QE of about 40% within the spectrum of interest of that is close to 850 nm. Therefore, both the absolute value of the QE for the IR channel and the channel separation between the blue and red channels on one side and the IR channel on the other side may be sufficient for some applications.

Many embodiments of the technology described above may take the form of computer- or controller-executable instructions, including routines executed by a programmable computer or controller. Those skilled in the relevant art will appreciate that the technology can be practiced on computer/controller systems other than those shown and described above. The technology can be embodied in a special-purpose computer, application specific integrated circuit (ASIC), controller or data processor that is specifically programmed, configured or constructed to perform one or more of the computer-executable instructions described above. Of course, any logic or algorithm described herein can be implemented in software or hardware, or a combination of software and hardware.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
a plurality of photodiodes arranged in rows and columns of a pixel array;
a light filter layer comprising a plurality of light filters comprising block, clear, and pass filters disposed over the plurality of photodiodes, the light filter layer having a first side facing the plurality of photodiodes and a second side facing away from the first side;
a color filter layer comprising a plurality of color filters comprising blue, green, red, and infrared filters disposed over the plurality of photodiodes, the color filter layer having a first surface facing the second side of the light filter layer and a second surface facing away from the first side of the light filter layer; and
a plurality of micro-lenses disposed proximate to the second surface of the color filter layer, wherein individual micro-lenses are configured to direct incoming light through corresponding light filter and color filter onto the respective photodiode.

2. The image sensor of claim 1,
wherein the plurality of photodiodes comprise an infrared (IR) channel, a green (G) channel, a red (R) channel, and a blue (B) channel configured to respond to corresponding wavelengths of the incoming light,
wherein the plurality of light filters comprise the clear (Clear) filter configured to transmit wavelengths of the incoming light, the block (Block) filter configured to block incoming infrared light, and the pass (Pass) filter configured to transmit incoming infrared light,
wherein the plurality of color filters comprises the blue (B) filter configured to transmit blue light, the green (G) filter configured to transmit green light, the red (R) filter configured to transmit red light, and the infrared (IR) filter configured to transmit infrared light, and
wherein the Pass filter is disposed between the IR channel and the IR filter.

3. The image sensor of claim 2, wherein the G channel is disposed proximate to a lateral side of the IR channel, and wherein the Clear filter is disposed between the G channel and the G filter.

4. The image sensor of claim 2, wherein the B channel is disposed diagonally with respect to the IR channel, and wherein the Block filter is disposed between the B channel and the B filter.

5. The image sensor of claim 2, wherein the R channel is disposed diagonally with respect to the IR channel, and wherein the Block filter is disposed between the R channel and the R filter.

6. The image sensor of claim 1, wherein individual photodiodes of the plurality of photodiodes comprise microstructures disposed in a semiconductor material of the photodiodes.

7. The image sensor of claim 6, wherein the microstructures are cell deep trench isolation (CDTI) microstructures.

8. The image sensor of claim 1,
wherein the plurality of photodiodes comprise an infrared (IR) channel, a green (G) channel, a red (R) channel and a blue (B) channel configured to respond to corresponding wavelengths of the incoming light, and
wherein the IR channel comprises microstructures disposed in a semiconductor material of the IR channel.

9. The image sensor of claim 8, wherein the microstructures are first microstructures, the image sensor further comprising second microstructures disposed in the semiconductor material of the G channel, wherein the G channel is disposed proximate to a lateral side of the IR channel.

10. The image sensor of claim 9, wherein the second microstructures are configured to direct the incoming light toward the IR channel.

11. The image sensor of claim 9, wherein the first microstructures and the second microstructures each comprises a plurality of cell deep trench isolation (CDTI) microstructures.

12. The image sensor of claim 11, wherein the second microstructures comprise a plurality of elongated microstructures that are parallel with the lateral side of the IR channel.

13. The image sensor of claim 12, wherein the second microstructures comprise at least one curved microstructure that is bent toward the lateral side of the IR channel.

14. The image sensor of claim 9, wherein the first microstructures comprise a plurality of square microstructures, and wherein the second microstructures comprise a plurality of elongated microstructures that are parallel with the lateral side of the IR channel.

15. The image sensor of claim 8, wherein the B channel is disposed diagonally with respect to the IR channel, and wherein the semiconductor material of the B channel is free from microstructures.

16. The image sensor of claim 8, wherein the IR channel is disposed diagonally with respect to the IR channel, and wherein the semiconductor material of the R channel is free from microstructures.

17. The image sensor of claim 8, wherein the microstructures comprise a plurality of cell deep trench isolation (CDTI) microstructures.

18. The image sensor of claim 17, wherein the individual microstructures of the plurality of CDTI microstructures have the same shape and size.

19. The image sensor of claim 17, wherein the individual microstructures of the plurality of CDTI microstructures have different shape or size.

20. The image sensor of claim 17, wherein the microstructures include features that extend into different depths within the semiconductor material.

* * * * *